United States Patent [19]
Brown et al.

[11] Patent Number: 5,428,506
[45] Date of Patent: Jun. 27, 1995

[54] CIRCUIT BOARD EMI SUPPRESSOR INCLUDING A LOSSY DIELECTRIC LAYER

[75] Inventors: Michael J. Brown, Durham; Leon C. Radzik; Jack D. Williams, both of Raleigh; Oliver D. Pitts, Spring Hope, all of N.C.

[73] Assignee: International Business Machines Corp., Armonk, N.Y.

[21] Appl. No.: 852,826

[22] Filed: Mar. 13, 1992

Related U.S. Application Data

[63] Continuation of Ser. No. 561,626, Aug. 2, 1990, abandoned.

[51] Int. Cl.⁶ .......................... H05K 1/11; H05K 9/00
[52] U.S. Cl. .................................. 361/794; 174/35 R; 174/35 MS; 174/255; 333/246; 333/247; 361/751; 361/763; 361/792; 361/795; 361/816; 361/818
[58] Field of Search .................. 174/35 R, 35 MS; 333/12, 238, 246, 247; 361/412, 414, 424

[56] References Cited

U.S. PATENT DOCUMENTS

| | | | |
|---|---|---|---|
| 3,189,847 | 6/1965 | Rymaszewski et al. | 361/424 |
| 3,904,886 | 9/1975 | Ehling et al. | 361/424 |
| 4,408,255 | 10/1983 | Adkins | 361/424 |
| 4,812,792 | 3/1989 | Leibowitz | 333/238 |
| 4,954,929 | 9/1990 | Baran | 361/414 |
| 4,965,408 | 10/1990 | Chapman et al. | 361/424 |

FOREIGN PATENT DOCUMENTS 0116199 4/1990 Japan .................. 361/424

*Primary Examiner*—Leo P. Picard
*Assistant Examiner*—Donald A. Sparks
*Attorney, Agent, or Firm*—Joscelyn G. Cockburn

[57] ABSTRACT

An improved printed circuit card or second level electronics package (circuit board) including a laminate of lossy material and dielectric material between the voltage supply plane (Vcc) and the ground (GND) plane. The laminate suppresses common mode noise that is generated by active components on the card or circuit board.

17 Claims, 5 Drawing Sheets

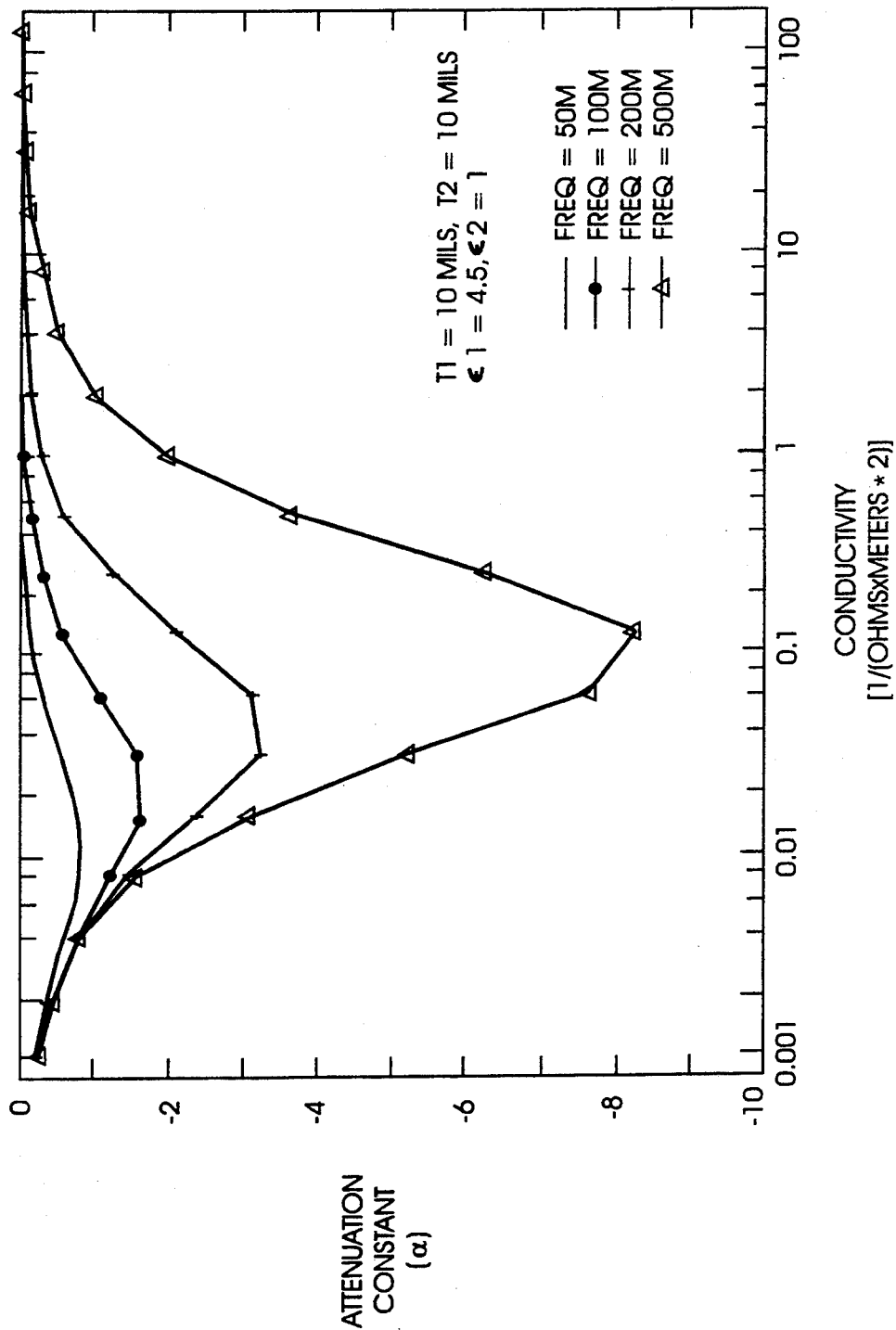

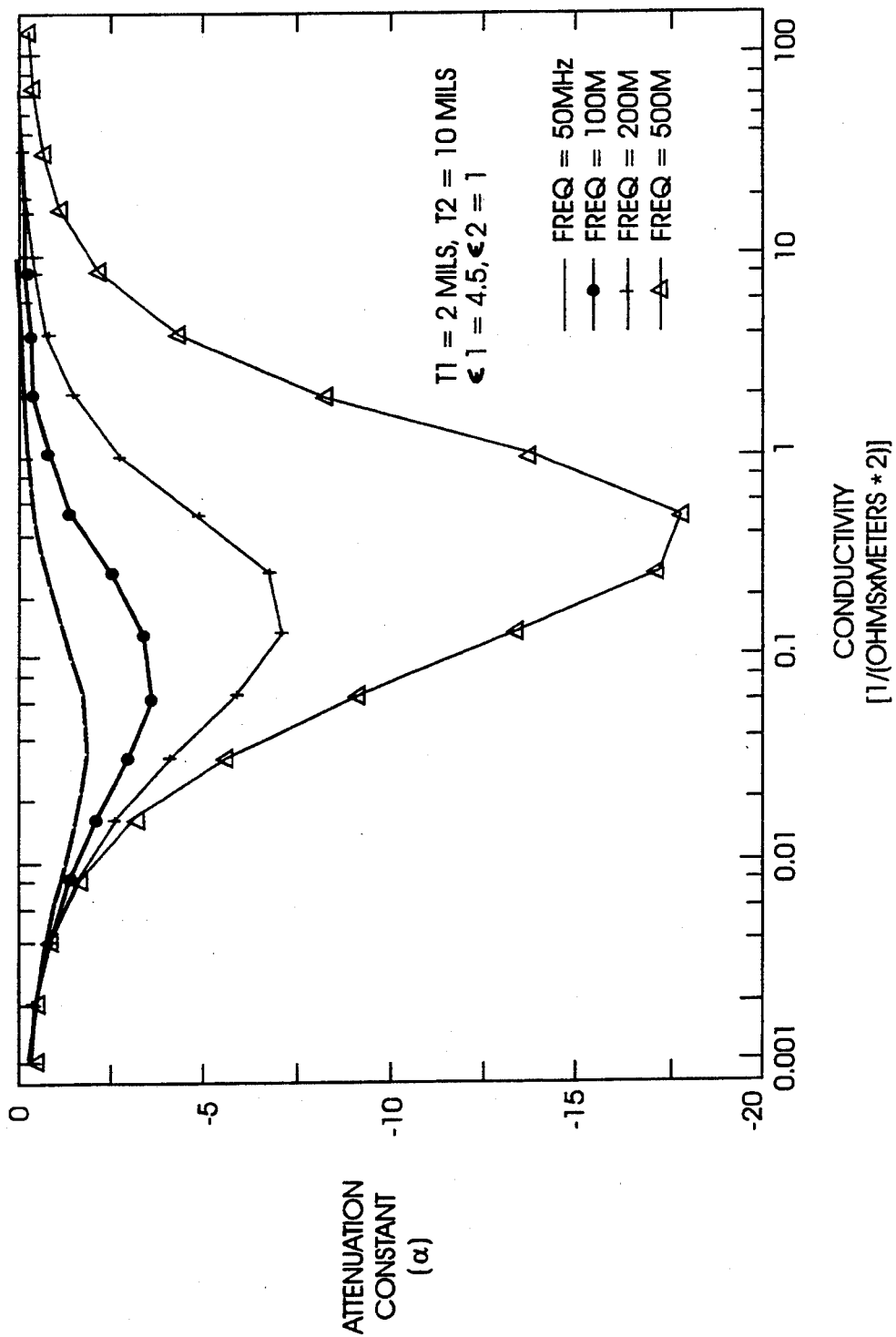

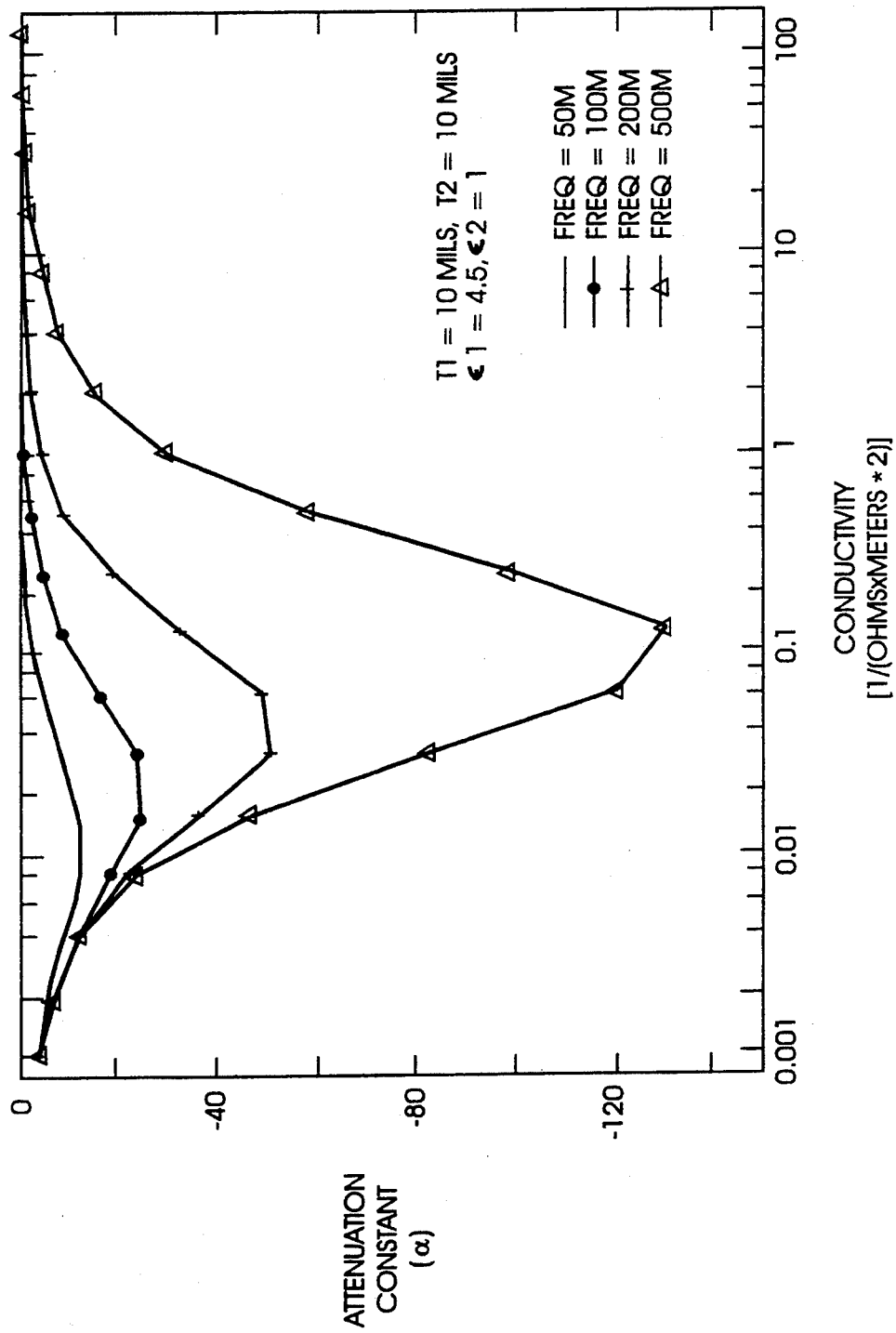

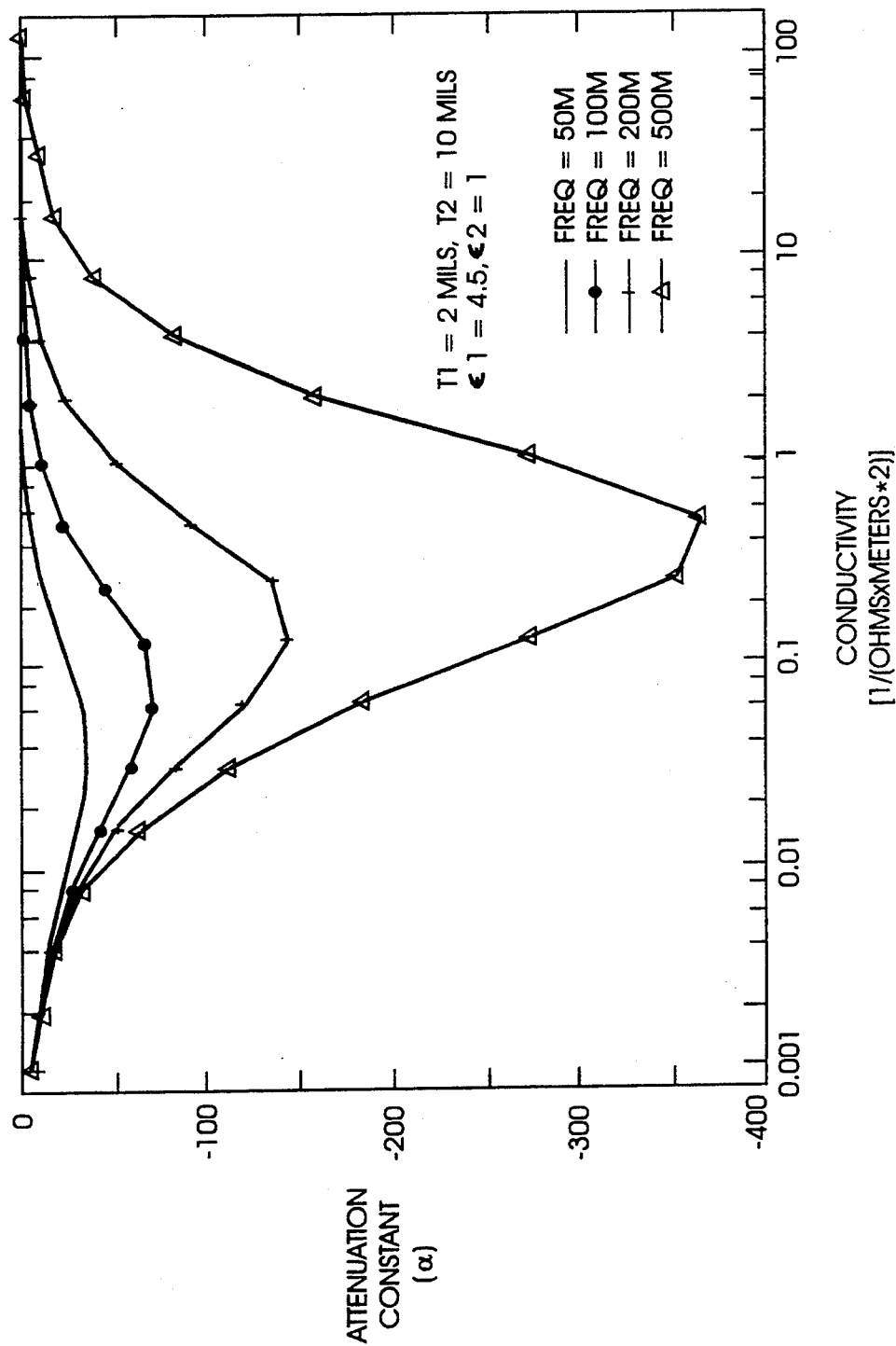

CIRCUIT BOARD EMI SUPPRESSOR INCLUDING A LOSSY DIELECTRIC LAYER

CROSS REFERENCE TO RELATED APPLICATION

The instant application is a continuation of Ser. No. 561,626, filed Aug. 12, 1990, now abandoned.

BACKGROUND OF THE INVENTION

1. Field of the Invention

The present invention relates to circuit card or board and, in particular, to its internal plane structure.

2. Prior Art

The electromagnetic interference (EMI) radiated by electronic products is controlled by regulatory bodies both in the U.S. and in foreign countries, who set emission standards for electronic products. If a product does not meet the applicable emission standards, the manufacturer may be fined exorbitant fees and, in extreme situations, the product may have to be withdrawn from the market.

To avoid these inconveniences, most manufacturers have built EMI facilities for testing products prior to marketing the products. The facilities are expensive and require personnel trained in the EMI discipline to operate them. Even after the initial release of a product, there is a need to recertify the product if it is to be used in a different system or if a new feature is added. The certification and recertification of products lead to an ever-increasing workload which demands more technicians and testing facilities. The net result is that the certification recertification of products has become costly and will become more so in the future.

It is believed that a major cause of radiated EMI is common-mode current on system cables. The common-mode current is caused by thousands of digital circuits that are on the circuit board or card, many of which are switching simultaneously. As the circuits switch, large current surges are generated causing high-Q, parallel-resonant circuits between the card's voltage and ground planes.

One prior art approach for solving the common-mode current problem is to decouple the digital logic. This is done by placing a series inductor and bypass capacitor or bypass capacitor alone between a module's power pin and the Vcc/ground planes. This solution is a step in the right direction in that it suppresses the problem at the source. For this approach to be completely effective, a decoupling network would be required for each active device on the card/bard. Due to the large number of active devices, providing separate decoupling networks for each device would be impractical and costly. Instead, what is done is to try and place a decoupling network on a few devices that are believed to be generating the most noise and only use bypass capacitors elsewhere. As a result, this technique is usually inadequate and requires additional techniques for solving the noise problem.

The ground isolation method is another technique used in the prior art. In this technique, a large ground sink (metal or metalized cabinet) is coupled via a very low impedance connection to the isolated ground plane. This implies that all card cable connectors must be located in the same area as the isolated ground and have the capability of being strapped to the metal sink. This technique is unsatisfactory since it is not always possible to have the cables in the same location.

Another method used to solve the prior art problem is the placing of large ferrite cores on the offending cables. The effectiveness of this approach is limited in that its attenuation is usually less than 4 to 6 dB. Moreover, the FCC prohibits this approach unless the seller provides all the cables with the products. This is not usually practical since a customer may elect to provide their own cable.

Finally, the transformer/balun approach is another technique used in the prior art. In this technique, a balun/transformer is mounted on the card. This approach is not practical in that its effectiveness is typically less than 4 dB and requires that all wires in an offending cable pass through the device. Furthermore, one input pin and one output pin, with traces, are required for each wire. All of this is difficult to accomplish with large cables and is usually limited to cables with 8 or 10 wires. In addition, unless all system cables are suppressed in the same manner, the noise energy tends to bypass the suppressed cable. Moreover, when any cable length is changed, the effectiveness of this approach is changed over the entire frequency spectrum and the system usually exhibits different failing frequencies.

SUMMARY OF THE PRESENT INVENTION

It is a general object of the present invention to provide a more efficient circuit card or circuit board than has heretofore been possible.

It is another object of the present invention to provide a circuit card or board in which common mode noise is suppressed at the source.

The above and other objects are achieved by adding a series impedance at only the high frequencies. This lowers the "Q" of the board voltage relative to ground circuit.

In particular, a lossy material with high permeability and/or high resistivity is affixed directly to the Vcc plane. The lossy material is insulated from the ground plane. DC and lower frequency currents flowing from the Vcc energy storage capacitor flow in the copper with no loss. Due to the skin effect, high frequency current will flow in the lossy material and be attenuated. The degree of attenuation depends on the resistivity and permeability of the lossy material and the thickness of the dielectric insulator. The lossy material thickness is also important at the lower noise frequencies.

The lossy material may be formulated as a paste having a conductive fiber (e.g., copper, nickel, etc.) a magnetic filler (e.g., nickel, iron, nickel/iron alloy) and a binder (e.g., epoxy, urethane, cellulose, acetate, etc.). The paste is coated or screen printed onto the voltage plane. Good results have been observed when the lossy material is thicker than the dielectric insulator.

The foregoing features and advantages of the invention will be more fully described in the accompanying drawings.

BRIEF DESCRIPTION OF THE DRAWINGS

FIGS. 3–6 show graphical models for the physical parameters of the lossy material.

PREFERRED EMBODIMENT

Figure 1:
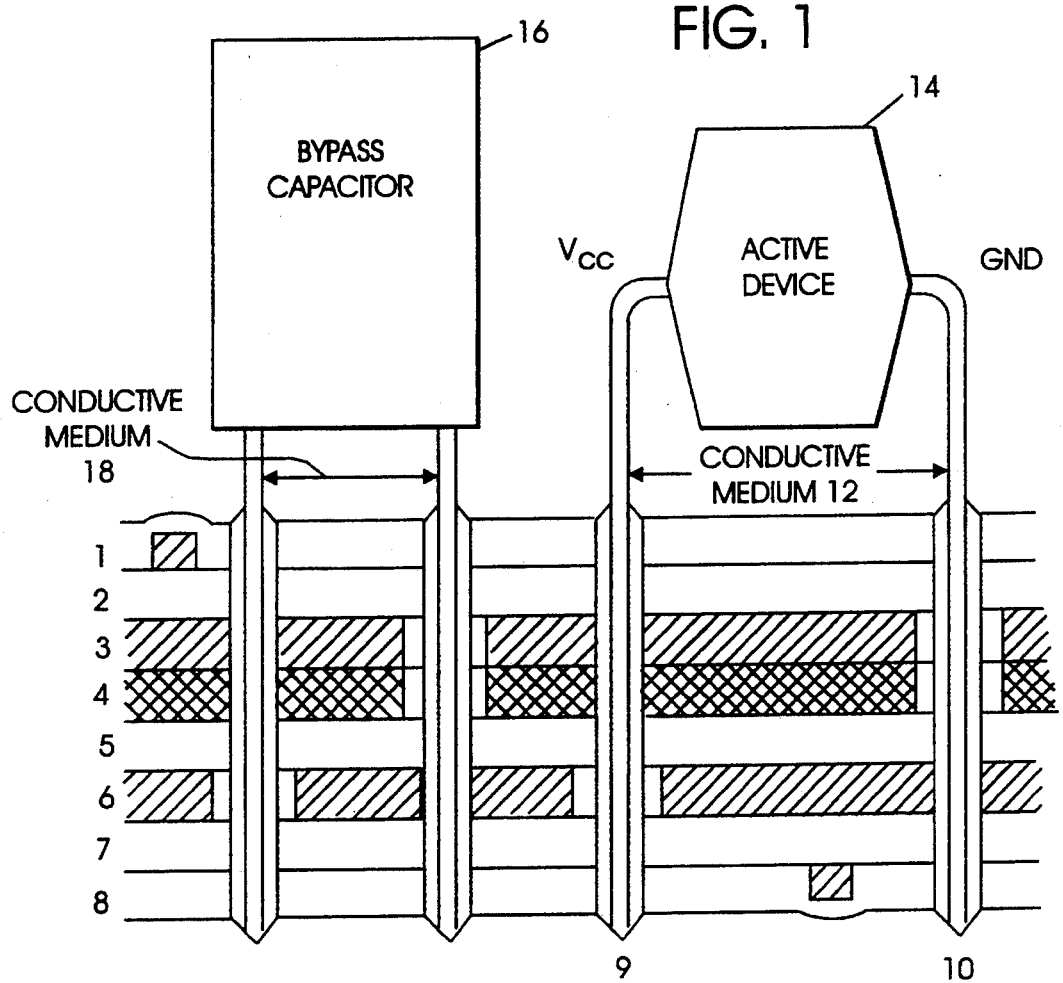
FIG. 1 shows a cross-section of a card/board according to the teachings of the present invention.

FIG. 1 shows a cross-section of a printed circuit card or printed circuit board according to the teachings of the present invention. The printed circuit card or board includes a top signal plane 1, dielectric insulator 2, copper plane 3, lossy conductive material (T2) 4, dielectric insulator (T1) 5, ground plane 6, dielectric insulator 7, bottom signal plane 8, active module power connection 9, active module ground connection 10, and conductive medium 12 for interconnecting active device 14 to the active module power connection and the active module ground connection. Bypass capacitor 16 is interconnected by conductive medium 18 to the ground and the power planes respectively. It should be noted that the configuration of FIG. 1 is a 2-signal, 2-power plane card or board. However, this configuration is merely illustrative and should not be construed as a limitation on the scope of this invention. However, the present invention works with any multi-layer circuit card or circuit board and it is well within the capabilities of one skilled in the art to pick other configurations without deviating from the scope or spirit of the present invention.

Still referring to FIG. 1, all printed circuit layers, except for the lossy material layer 4, can be of standard printed circuit construction. The lossy material layer 4 is somewhat conductive and in contact (that is, conductive connection) with the copper power or voltage plane (layer 3). The printed circuit board can be assembled in any desired configuration with established manufacturing processes. However, to prevent signal loss, it may be advantageous to use two or more power planes, and the lossy material should only be placed between the power planes. If signal loss is desirable, the lossy material could also be placed on the side of the power plane adjacent to the signal plane to be attenuated. Lossy material may be used on all power and/or ground planes. However, when this method is used on a ground plane, all active components need a bypass capacitor to prevent ground shift.

Figure 2:
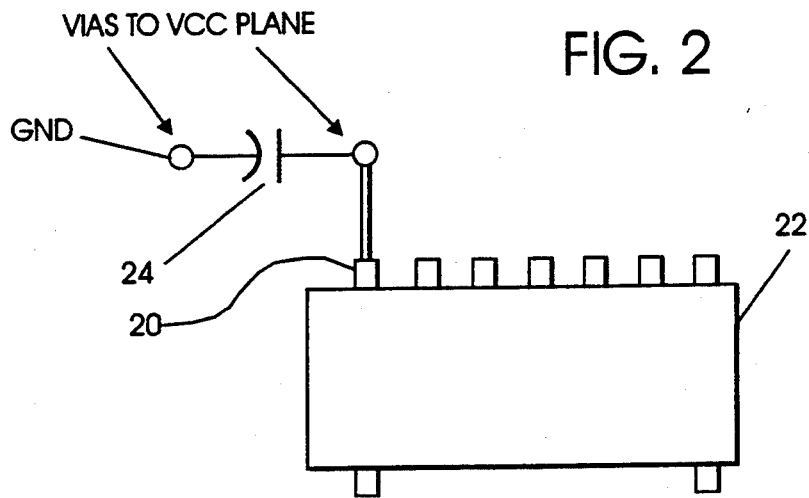
FIG. 2 is a graphical representation showing interconnections with a bypass capacitor.

Turning to FIG. 2 for the moment, a configuration with the bypass capacitor is shown. In this configuration, the power pin 20 of module 22 is interconnected through vias to the power (Vcc) plane. A bypass capacitor 24 interconnects the Vcc plane to the ground (Gnd) plane.

FIGS. 3-6 show graphical models for the lossy material or compound. The horizontal axis of each graph represents conductivity while attenuation is represented on the vertical axis. The graph gives a graphical representation of the components that are used in forming the lossy material. The effectiveness of the lossy material is characterized by its permeability, conductivity, thickness and the thickness of the insulator between the lossy material and the ground plane. Any changes in the constituencies of the lossy material alters the effectiveness of this method in suppressing noise at the source. Each graph in the figures shows the behavior of the lossy material at frequencies of 50 MHz, 100 MHz, 200 MHz and 500 MHz. In order to make the comparison more meaningful and easy to understand, the characteristic of the components used in the lossy material are written on each of the figures. Thus, the card used in each of the models is a two-layer card. As stated above, cards (with other numbers of layers) could be used. While the models are not exact, they illustrate the trends (the lossy effect) of the various material constants as a function of conductivity of the lossy material.

The model shows that for the material to be effective in the 50 to 500 MHz range, it is necessary to accurately adjust the conductivity. Even though the permeability of the lossy material and the thickness of the dielectric insulator are important, they vary in a predictable manner. However, it would appear that if the conductivity of the lossy material is too high or too low, its ability to suppress noise is adversely affected.

By way of example, the following composition of lossy materials have been found to suppress noise effectively at the source: The material may be screen printed onto the voltage plane or coated onto said plane.

By way of example, the following list of lossy material compositions have been shown promising results (38 to 42 dB/meter at 300 MHz), in the laboratory when assembled in the manner specified by this invention:

3) Metal foils and metal clad materials (i.e., iron, nickel and iron/nickel compositions).
2) Paste composites with different combinations of iron, nickel and copper fillers with epoxy and lacquer binders.

Other lossy materials with high permeability could be used along with different binders such as urethane, polyester, and modifications thereof.

Other metallization processes such as electroless plating and vapor deposition may be used. Surface roughness of the lossy material and grinding the copper plane should improve the performance.

In some cases where the dc current is limited and/or the dc voltage drop is not important, and when the lossy material is composed of a relatively high conductivity material (such as metal foil), the lossy material can be used in lieu of a lossy/copper clad combination.

The lossy material could be used instead of the voltage plane. It would perform the function of distributing voltage and attenuate high frequency signals.

The present structure imposes a high impedance connection between the series resonance circuits that are connected between the power and ground planes at high frequencies. It preserves a low impedance between the active circuits and the energy storage capacitor in the power plane at low frequencies. The structure can be used selectively to dampen the signal waveform if needed.

While the invention has been particularly shown and described with reference to a preferred embodiment thereof, it will be understood that various changes of form and details may be made therein without departing from the spirit and scope of the invention.

We claim:

1. An improved multilayer circuit card or board for use in an electronic machine comprising:
   a supply voltage means for providing electrical power to said card or board;
   a lossy magnetic and electrically conductive layer for attenuating high frequency signals directly affixed to one surface of said supply voltage means;
   an insulating means disposed on the lossy magnetic and electrically conductive layer;
   a ground (GND) conductive means disposed on the insulating means;
   a support means for mounting electrical devices connected to the supply voltage means; with said supply voltage means, the lossy magnetic and electrically conductive layer, the insulating means and the support means are bonded together to to form the multi-layer card or board;

a plurality of electrical devices mounted on said support means; and conductive means interconnecting selected electrical devices, the supply voltage means and the ground conductive means.

2. The improved multilayer circuit card or board set forth in claim 1 wherein the supply voltage means and the ground conductive means are planar.

3. The improved circuit card of claim 1 wherein the lossy magnetic and electrically conductive material includes a thickness within the range of 2 mils to 10 mils.

4. The improved circuit card of claim 3 wherein the insulating means includes a thickness of 10 mils.

5. An improved structure for use as internal layers of a multilayer circuit card or circuit board to suppress common mode noise caused by circuit components on said multilayer card or board, said structure comprising:
   a supply voltage plane for providing power to the board or card;
   a layer of lossy magnetic and electrically conductive material placed in direct contact with a planar surface of the supply voltage plane; and
   a plane of insulating material disposed in contact with a planar surface of said lossy magnetic and electrical conductive material; and
   a ground (GND) voltage plane disposed in contact with a planar surface of the insulating material.

6. The improved structure of claim 5 further including a bottom insulating plane disposed in contact with a planar surface of the ground voltage plane; and
   a top insulating plane disposed in contact with another planar surface of said supply voltage plane.

7. The improved structure of claim 5 wherein the supply voltage plane and the ground voltage plane are copper.

8. The improved structure of claim 5 wherein the lossy magnetic and electrically conductive material is screen printed onto the voltage plane.

9. The improved structure of claim 5 wherein the lossy magnetic and electrically conductive material is formulated into a paste and coated onto the voltage plane.

10. The improved structure of claim 9 wherein the lossy magnetic and electrically conductive material is formulated into a paste and coated onto the voltage plane.

11. The improved structure of claim 10 wherein the magnetic filler includes nickel, iron, and nickel/iron alloy.

12. The improved structure of claim 10 wherein the electrically conductive fiber includes copper and nickel.

13. The improved structure of claim 10 wherein the binder includes epoxy, urethane, cellulose and acetate.

14. An improved multilayer printed circuit card or multilayer printed circuit board for use in electrical machines comprising:
    an internal power plane for providing electrical power to the multilayer printed circuit card or multilayer printed circuit board;
    a first dielectric insulating plane disposed on one surface of the power plane;
    a layer of lossy magnetic and electrically conductive material directly disposed on another surface of the internal power plane;
    a second dielectric insulating plane disposed on a planar surface of the lossy magnetic and electrically conductive material;
    an internal ground voltage plane disposed in contact with a planar surface of the second dielectric insulating plane;
    a third dielectric insulating plane disposed in contact with a planar surface of the internal ground voltage plane;
    a plurality of circuit components mounted to said multilayer printed circuit card or multilayer printed circuit board; and
    conductive means for interconnecting selective components with the internal power plane and the internal voltage plane.

15. The improved circuit card or circuit board of claim 14 further including at least one capacitive means for interconnecting a power pin of at least one circuit component with the internal ground plane.

16. An improved structure for use as internal layers of a multilayer printed circuit card or multilayer printed circuit board to suppress common mode noise caused by circuit components on the card or board, said structure comprising:
    a continuous voltage supply plane (Vcc);
    a layer of lossy magnetic and electrically conductive material directly connected to the voltage plane;
    a plane of insulating material disposed in contact with a planar surface of the lossy magnetic and electrically conductive material; and
    a continuous ground (GND) voltage plane disposed in contact with a planar surface of the insulating material.

17. An improved structure for use as internal layers of a multilayer printed circuit card or multilayer printed circuit board to suppress common mode noise caused by circuit components on the card or board, said structure comprising:
    a voltage supply plane;
    a plane of insulating material disposed in contact with a planar surface of said voltage supply plane;
    a plane of lossy magnetic and electrically conductive material disposed in contact with a planar surface of the insulating material; and
    a ground voltage plane directly affixed to the plane of lossy magnetic and electrically conductive material.

* * * * *